United States Patent
Su et al.

(10) Patent No.: US 9,103,982 B2
(45) Date of Patent: Aug. 11, 2015

(54) ORGANIC ELECTROLUMINESCENT DISPLAY AND METHOD FOR FABRICATING THE SAME

(71) Applicants: INNOCOM TECHNOLOGY (SHENZHEN) CO., LTD., Shenzhen, Guangdong Province (CN); CHIMEI INNOLUX CORPORATION, Chu-Nan, Miao-Li County (TW)

(72) Inventors: Tsung-Yi Su, Chu-Nan (TW); Du-Zeng Peng, Chu-Nan (TW); Hsiang-Lun Hsu, Chu-Nan (TW)

(73) Assignees: INNOCOM TECHNOLOGY (SHENZHEN) CO., LTD., Shenzhen (CN); INNOLUX CORPORATION, Chu-Nan (TW)

( * ) Notice: Subject to any disclaimer, the term of this patent is extended or adjusted under 35 U.S.C. 154(b) by 68 days.

(21) Appl. No.: 13/663,079

(22) Filed: Oct. 29, 2012

(65) Prior Publication Data

US 2013/0119857 A1    May 16, 2013

(30) Foreign Application Priority Data

Nov. 10, 2011  (TW) .............................. 100141122 A (51) Int. Cl.
| | |
|---|---|
| H01J 1/62 | (2006.01) |
| G02B 5/20 | (2006.01) |
| H01L 51/52 | (2006.01) |
| H01L 27/32 | (2006.01) |
| H05B 33/10 | (2006.01) |

(52) U.S. Cl.
CPC .............. *G02B 5/201* (2013.01); *H01L 27/322* (2013.01); *H01L 51/5284* (2013.01); *H05B 33/10* (2013.01)

(58) Field of Classification Search
CPC .......................... H01L 51/5284; H01L 27/322
USPC ................................................... 313/498–512
See application file for complete search history.

(56) References Cited

U.S. PATENT DOCUMENTS

| | | | |
|---|---|---|---|
| 7,990,058 B2 * | 8/2011 | Cok et al. ........................ | 313/506 |
| 2006/0290276 A1 * | 12/2006 | Cok et al. ........................ | 313/512 |
| 2009/0079335 A1 * | 3/2009 | Mitsuya et al. ................ | 313/504 |
| 2009/0212694 A1 * | 8/2009 | Cok ................................ | 313/506 |

FOREIGN PATENT DOCUMENTS

| | | |
|---|---|---|
| TW | 496981 | 8/2002 |
| TW | I281752 | 5/2007 |

\* cited by examiner

*Primary Examiner* — Anh Mai
*Assistant Examiner* — Zachary J Snyder
(74) *Attorney, Agent, or Firm* — Liu & Liu (57) ABSTRACT

An organic electroluminescent display (OELD) device at least includes a first assembly and a second assembly. The first assembly has a first substrate and an organic electroluminescent unit formed on the first substrate. The second assembly, assembled with the first assembly, includes a second substrate, a color filter layer and a patterned light-shielding layer. The color filter layer is disposed on the second substrate and has plural colored regions with different colors. The patterned light-shielding layer is disposed on the color filter layer and between the colored regions. A part of the patterned light-shielding layer contacts the first assembly to maintain a cell gap between the first assembly and the second assembly.

21 Claims, 5 Drawing Sheets

ORGANIC ELECTROLUMINESCENT DISPLAY AND METHOD FOR FABRICATING THE SAME

This application claims the benefit of Taiwan application Serial No. 100141122, filed Nov. 10, 2011, the subject matter of which is incorporated herein by reference.

BACKGROUND OF THE DISCLOSURE

1. Field of the Disclosure

The disclosure relates in general to a display device and method of fabricating the same, and more particularly to an organic electroluminescent display (OELD) device and a method for fabricating the same.

2. Description of the Related Art

In comparison to the conventional cathode-ray tube display device, the flat panel display device (such as the liquid crystal display device (LCD), the plasma display device (PDP) and the organic electroluminescent display (OELD) device), being lighter, slimmer and compacter, has gradually become the mainstream product. Particularly, the OELD device further has the advantages of flexibility, portability, full color, high brightness, lower power consumption, wider view-angle and faster response rate.

Currently, the monochromic OLED technique is near matured. Considering the next generation flat display and the applications using the same, the full color OLED technique is an inevitable trend. Currently, there are three full color OLED techniques available. According to the first technique, the RGB sub-pixels required for full color are implemented by three independent elements. According to the second technique, the light of blue light OLED is converted into RGB lights by a color change medium (CCM). According to the third technique, the light of white light OLED is converted into RGB lights by a plurality of color filters. Each technique has its advantages and disadvantages. The third technique implements a full color OLED by using a white light element plus color filters. Since the color filter technique is already matured in the LCD industry, it is not difficult to find RGB color filters applicable to the white light OLED and further transfer the technique to the OLED industry. Furthermore, the fabricating procedures for the white light OLED plus color filters are relatively simple, and the fabricating cost for full color OLED can thus be further reduced.

Figure 1:
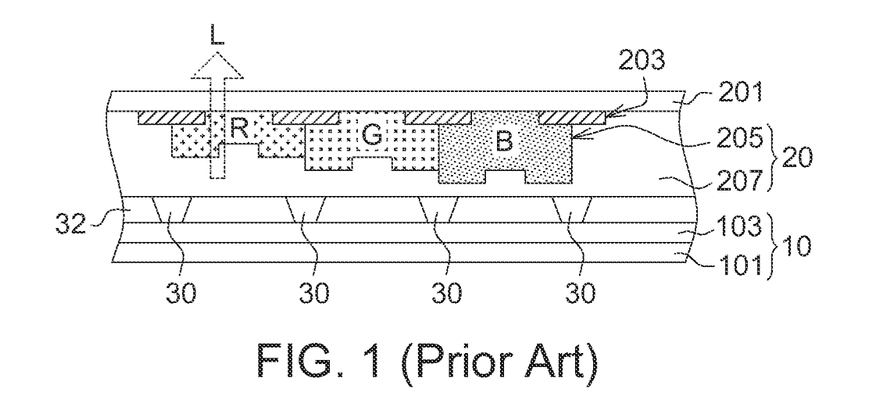
FIG. 1 (prior art) shows a partial cross-sectional view of a generally known OELD device.

FIG. 1 shows a partial cross-sectional view of a generally known OELD device. The OELD device is formed mainly by an organic light emitting diode (OLED) assembly 10 and a color filter (CF) assembly 20. The OLED assembly 10 and the CF assembly 20 are assembled to each other, and the cell gap between the two assemblies is controlled by plural spacers 30. The OLED assembly 10 includes a first substrate 101 with thin-film transistor units. The organic electroluminescent unit 103, interposed between two electrodes such as a reflective electrode and a transparent electrode (the electrodes are not illustrated in the diagram), is formed on the first substrate 101 with thin-film transistor units. The generally known method for fabricating the CF assembly 20 includes the following steps. A glass substrate 201 is pre-treated, such as treated by a cleaning process. A photolithography process is applied on the pre-treated glass substrate 201 to form a patterned light-shielding layer 203, such as a black matrix (BM). A color filter layer 205 is formed by sequentially forming a red color filter layer CF-R, a green color filter layer CF-G and a blue color filter layer CF-B. Then, an overcoat (OC) layer 207 is formed to cover the color filter layer 205. Since the thicknesses of the red, the green and the blue color filter layers are not the same, planarization of the overcoat layer 207 on the red, the green and the blue color filter layers could be achieved. A plurality of spacers 30 may be formed on the overcoat layer 207. After the OLED assembly 10 and the CF assembly 20 are assembled with each other, the spacers 30 maintain a cell gap between the two assemblies. However, the disposition of the overcoat layer 207 and the spacers 30 increases the overall thickness of the display device, so that color shift may occur at a smaller angle. In addition, when the spacers are disposed beside one of the red, the green and the blue color filter layers, the width of the black matrix for the particular color is increased, and the aperture ratio for the particular color is reduced.

SUMMARY OF THE DISCLOSURE

The disclosure is directed to an organic electroluminescent display (OELD) device and a method for fabricating the same which are capable of reducing the overall thickness of display device, improving phenomena of color shift, and simplifying the fabricating procedures.

According to one embodiment of the present disclosure, an OELD device at least including a first assembly and a second assembly is provided. The first assembled has a first substrate and an organic electroluminescent unit formed on the first substrate. The second assembly, assembled with the first assembly, includes a second substrate, a color filter layer and a patterned light-shielding layer. The color filter layer is disposed on the second substrate and has a plurality of colored filter regions with different colors. The patterned light-shielding layer is disposed on the color filter layer and between the colored filter regions. A part of the patterned light-shielding layer contacts the first assembly to maintain a cell gap between the first assembly and the second assembly.

According to another embodiment of the present disclosure, a color filter assembly used in an OELD device is provided. The color filter assembly at least includes a substrate, a color filter layer, and a patterned light-shielding layer. The color filter layer is disposed on substrate and has a plurality of colored filter regions with different colors. The patterned light-shielding layer is disposed on the color filter layer and between the colored filter regions. A part of the patterned light-shielding layer maintains a cell gap for the OELD device.

According to an alternate embodiment of the present disclosure, a method for fabricating an OELD device is provided. The method at least includes:

providing a first assembly including a first substrate and an organic electroluminescent unit formed on the first substrate;

providing a second assembly including a second substrate, a color filter layer and a patterned light-shielding layer, wherein the color filter layer is formed on the second substrate and has a plurality of color filter regions, and the patterned light-shielding layer is disposed on the color filter layer and between the colored filter regions; and assembling the first assembly and the second assembly, wherein a part of the patterned light-shielding layer contacts the first assembly to maintain a cell gap between the first assembly and the second assembly.

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

An organic electroluminescent display (OELD) device and a method for fabricating the same are disclosed in the following embodiments. As the patterned light-shielding layer may be used to maintain a cell gap for a display device, the overall thickness of the display device is reduced, the phenomenon of color shift is improved, and the fabricating procedures are simplified. It is to be understood that both the foregoing general description and the following detailed description regarding the detailed structures and fabricating procedures are exemplary and explanatory only, and are not restrictive of the disclosed embodiments as claimed.

The OELD device of an embodiment is fabricated by assembling a first assembly and a second assembly. The first assembly is such as an organic light emitting diode (OLED) assembly, and the second assembly is such as a color filter (CF) assembly. In practical application, the color filter regions of the color filter assembly may be arranged as a strip-type color filter array as disclosed in the first or the second embodiment, or arranged as a quad-type color filter array as disclosed in the third embodiment, and the present disclosure does not impose further restrictions.

First Embodiment

Figure 2A:
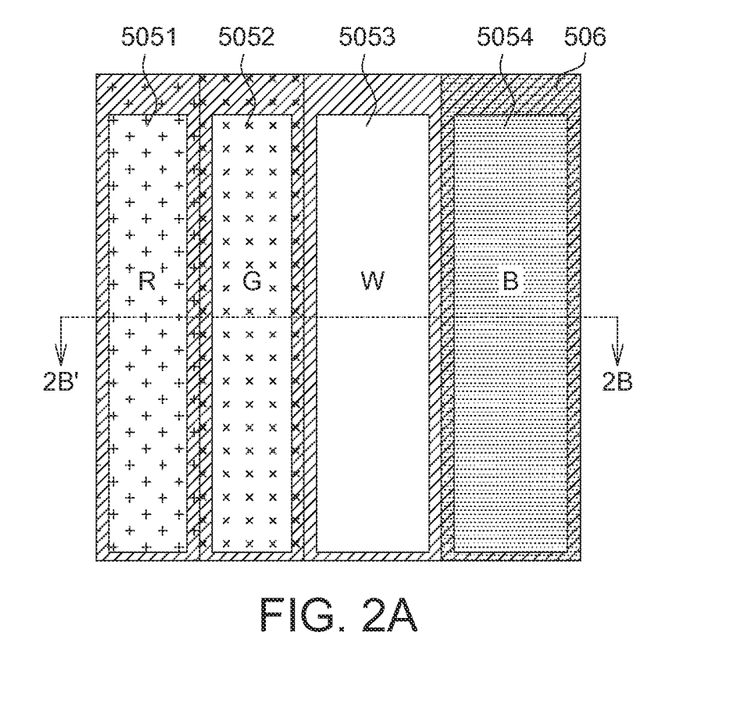
FIG. 2A shows a top view of an OELD device according to the first embodiment of the disclosure.
Figure 2B:
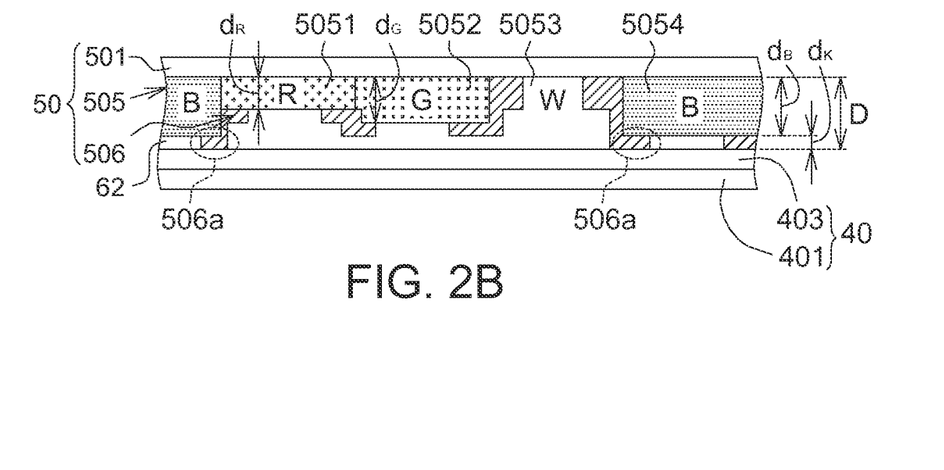
FIG. 2B shows a partial cross-sectional view of a display device of FIG. 2A along a cross-sectional line 2B-2B'.

FIG. 2A shows a top view of an OELD device according to the first embodiment of the disclosure. FIG. 2B shows a partial cross-sectional view of a display device of FIG. 2A along a cross-sectional line 2B-2B'. Referring to both FIG. 2A and FIG. 2B. The organic electroluminescent display (OELD) device includes a first assembly 40 and a second assembly 50. The first assembly 40, such as an organic light emitting diode assembly, has a first substrate 401 and an organic electroluminescent unit 403 formed on the first substrate 401. The second assembly 50, such as a color filter assembly, includes a second substrate 501, a color filter layer 505 and a patterned light-shielding layer 506.

The color filter layer 505 is formed on the second substrate 501 and has a plurality of colored filter regions with different colors. The colored filter regions are such as red sub-regions 5051, green sub-regions 5052, white sub-regions 5053 and blue sub-regions 5054. Each pixel region includes one red sub-region 5051, one green sub-region 5052, one white sub-region 5053 and one blue sub-region 5054 which are arranged in parallel as a strip. The patterned light-shielding layer 506 is formed on the second substrate 501 and around the colored filter regions. As indicated in the OELD device of FIG. 2B, a part 506a of the patterned light-shielding layer 506 contacts the first assembly 40 to maintain a cell gap D between the first assembly 40 and the second assembly 50.

As indicated in FIG. 2B, the thicknesses of the red, the green and the blue sub-regions are not the same. Normally, the thickness $d_B$ of the blue sub-region 5054 is the largest, the thickness $d_G$ of the green sub-region 5052 ranks next, and the thickness $d_R$ of the red sub-region 5051 is the smallest. The part 506a of the patterned light-shielding layer 506 which contacts the first assembly 40 is correspondingly located in the blue sub-region 5054 to maintain a cell gap between the first assembly 40 and the second assembly 50. Exemplarily but not restrictively, the part 506a of the patterned light-shielding layer 506 could be disposed between the blue sub-region 5054 and the adjacent sub-region with different color such as a white sub-region 5053. Meanwhile, the cell gap D between the first assembly 40 and the second assembly 50 is equal to the sum of the thickness $d_B$ of the blue sub-region 5054 and the thickness $d_K$ of the patterned light-shielding layer 506a.

In the present embodiment, the OELD device of further includes a filler 62 disposed between the first assembly 40 and the second assembly 50, and the filler 62 fills up the space between the color filter layer 505 and the patterned light-shielding layer 506. After filling, the filler 62 (such as gel) may further be cured with a light source, and the filler 62 fills the air gap between the first assembly 40 and the second assembly 50 to avoid the residuals of air or moisture. By doing so, the stability and lifespan of the organic electroluminescent unit of the assembly are increased, and the overall strength of the organic light emitting diode (OLED) device is enhanced.

In the present embodiment, the patterned light-shielding layer 506 is realized by such as a black matrix (BM). The black matrix is formed by applying a black photoresist (PR) by a spin coating process, sequentially followed by a pre-baking process, an exposing process, a developing process and a post-baking process. Examples of material of the filler 62 include epoxy, acrylic, poly-ester or polyurethane. In practical applications, the materials of the patterned light-shielding layer and the filler are determined according to actual needs, and the present disclosure does not impose further restrictions.

Figure 3:
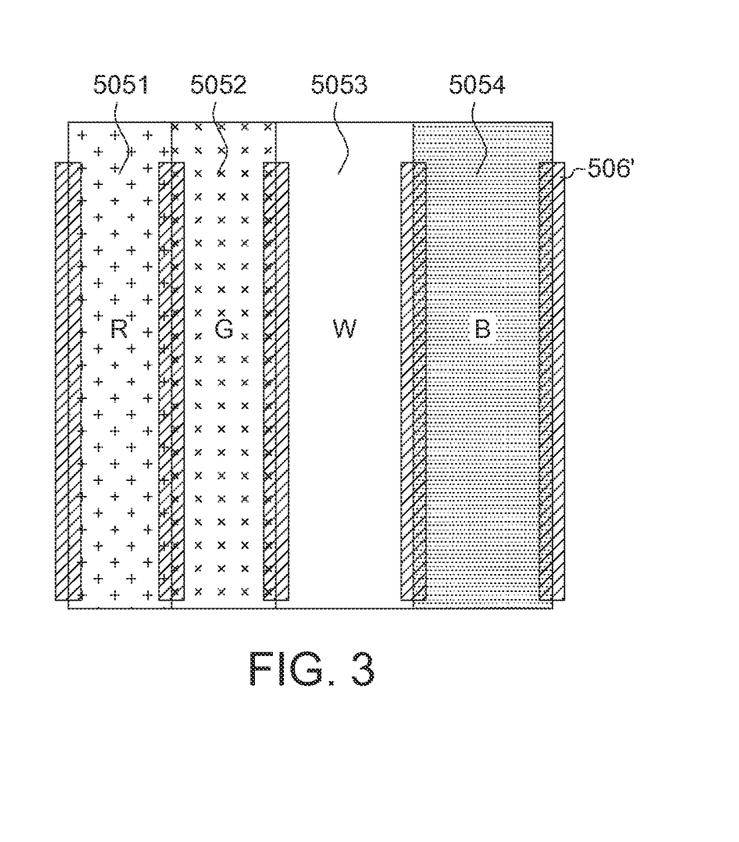
FIG. 3 shows a top view of another OELD device according to the first embodiment of the disclosure.

As indicated in FIG. 2A, the patterned light-shielding layer 506 is disposed around the colored filter regions. However, the present embodiment is not limited by the disclosed exemplification. The patterned light-shielding layer may also be formed between the colored filter regions as long as the patterned light-shielding layer shields the light and avoid the mixture of the light between adjacent color filter regions with different colors. FIG. 3 shows a top view of another OELD device according to the first embodiment of the disclosure. The cross-sectional view of the display device of FIG. 3 may be obtained with reference to FIG. 2B. As indicated in FIG. 3, the patterned light-shielding layer 506' is disposed between two adjacent color filter regions. For example, the patterned light-shielding layer 506' is disposed between the red sub-region 5051 and the green sub-region 5052, or disposed between the green sub-region 5052 and the white sub-region 5053, or disposed between the white sub-region 5053 and the blue sub-region 5054.

In comparison to the generally known structure of the OELD device with an overcoat layer (as indicated in FIG. 1), the OELD device of the present embodiment replaces conventional spacers with a part of patterned light-shielding layer, and also omits the overcoat layer, not only largely reducing the overall thickness of display device (the thickness of a black matrix is about 1.4 μm and the thickness of a conventional photoresist spacers is about 2 μm), but also simplifying the fabricating procedures. In addition, the thinned display device makes color shift can only occur at a larger viewing angle, so the display quality is further improved.

Second Embodiment

Figure 4A:
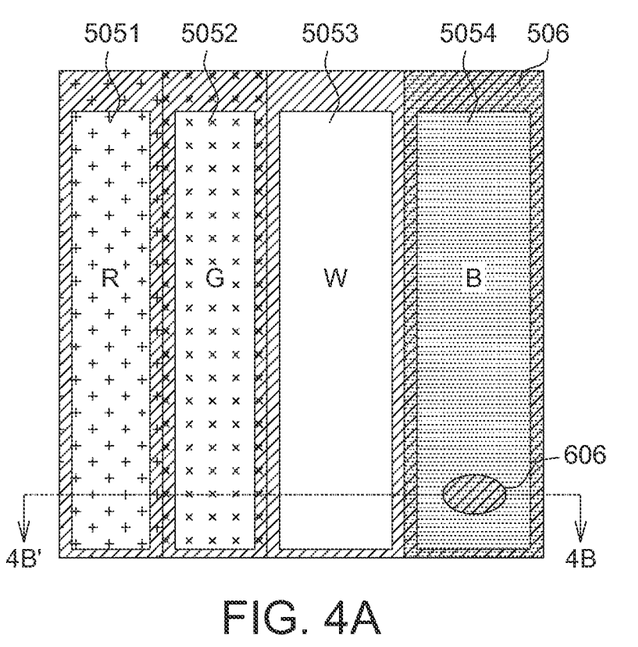
FIG. 4A shows a top view of an OELD device according to the second embodiment of the disclosure.
Figure 4B:
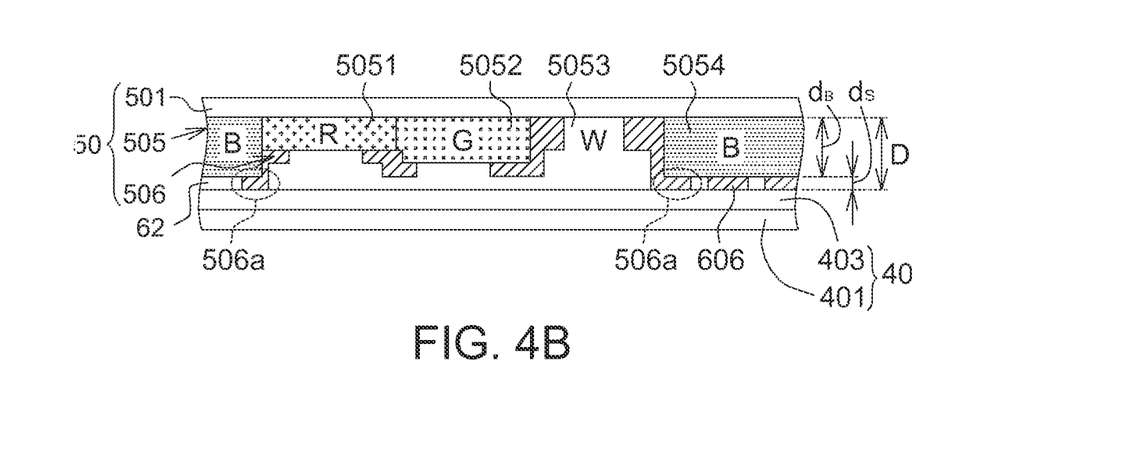
FIG. 4B shows a partial cross-sectional view of a display device of FIG. 4A along a cross-sectional line 4B-4B'.

FIG. 4A shows a top view of an OELD device according to the second embodiment of the disclosure. FIG. 4B shows a partial cross-sectional view of a display device of FIG. 4A along a cross-sectional line 4B-4B'. Referring to both FIG. 4A and FIG. 4B. As for the elements of the second embodiment common to that of the first embodiment, the same reference numerals are used, and the similarities are not repeated.

Like the OELD device of the first embodiment, the OELD device of the second embodiment has a first assembly 40 and a second assembly 50, a color filter layer 505 and a patterned light-shielding layer 506 disposed on the color filter layer 505. In the present embodiment, several spacers 606 are formed at the same time with the formation of the patterned light-shielding layer 506. After the first assembly 40 and the second assembly 50 are assembled, the spacers 606 may also contact the first assembly 40 to maintain a cell gap D between the first assembly 40 and the second assembly 50. Therefore, the bottom of the spacer 606 contacts the color filter layer 505 of the second assembly 50 and the top of the spacer 606 contacts the first assembly 40. As indicated in FIG. 4B, the spacers 606 of the present embodiment are such as located at a corner of the blue sub-region 5054. Meanwhile, the cell gap D between the first assembly 40 and the second assembly 50 is equal to the sum of the thickness $d_B$ of blue sub-region 5054 and the thickness $d_S$ of the spacers 606.

Figure 5:
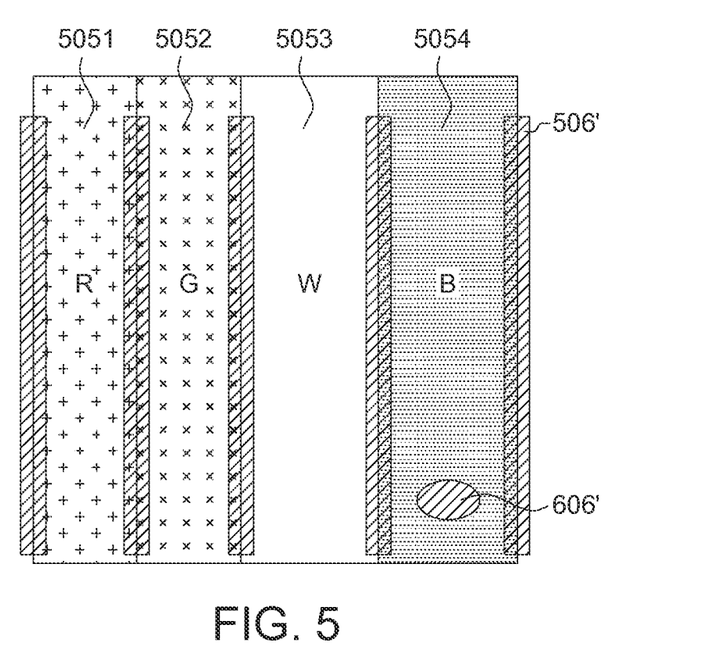
FIG. 5 shows a top view of another OELD device according to the second embodiment of the disclosure.

As indicated in FIG. 4A, the patterned light-shielding layer 506 is disposed around the color filter regions. However, the present embodiment is not limited by the disclosed exemplification. For example, the patterned light-shielding layer may also be formed between the colored filter regions as indicated in FIG. 5 which shows a top view of another OELD device according to the second embodiment of the disclosure. The cross-sectional view of the display device of FIG. 5 may be obtained with reference to FIG. 4B. As indicated in FIG. 5, the patterned light-shielding layer 506' is disposed between two adjacent filter regions. For example, the patterned light-shielding layer 506' is disposed between the red sub-region 5051 and the green sub-region 5052, or between the green sub-region 5052 and the white sub-region 5053, or between the white sub-region 5053 and the blue sub-region 5054. The spacer 606' could be disposed at a corner of the blue sub-region 5054.

Third Embodiment

Figure 6A:
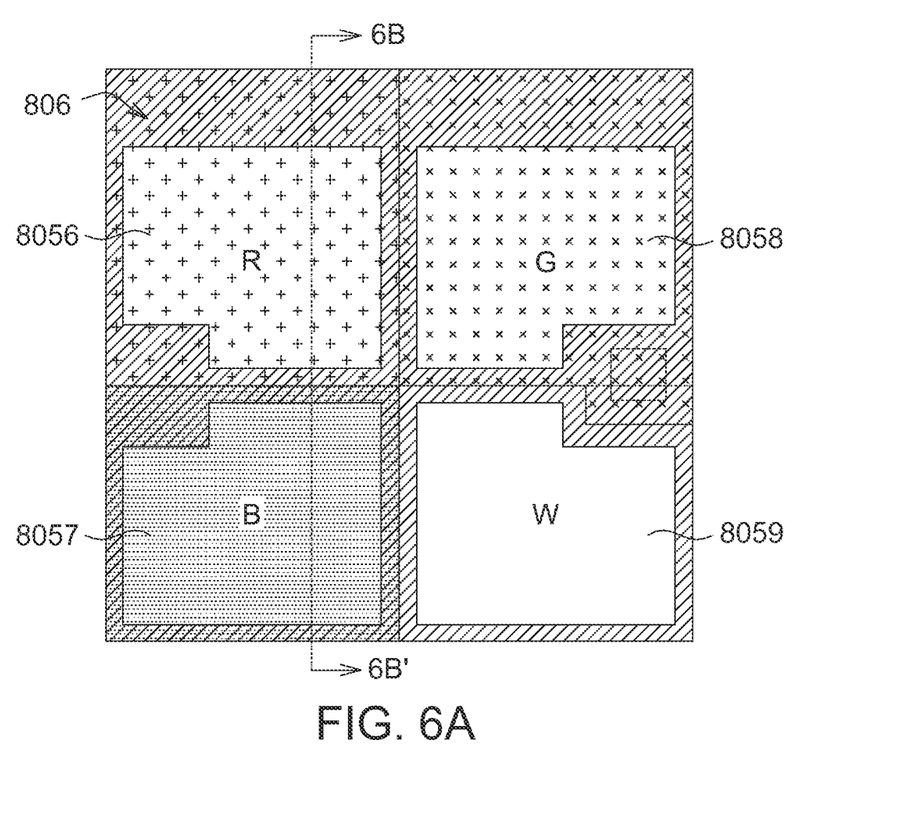
FIG. 6A shows a top view of an OELD device according to the third embodiment of the disclosure.
Figure 6B:
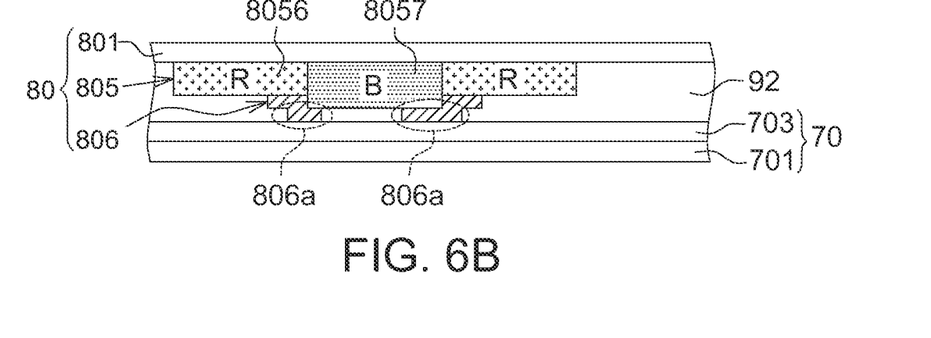
FIG. 6B shows a partial cross-sectional view of a display device of FIG. 6A along a cross-sectional line 6B-6B'.

FIG. 6A shows a top view of an OELD device according to the third embodiment of the disclosure. FIG. 6B shows a partial cross-sectional view of a display device of FIG. 6A along a cross-sectional line 6B-6B'. Referring to both FIG. 6A and FIG. 6B.

Similarly, the OELD device includes a first assembly 70 and a second assembly 80, and a filler 92 disposed between the first assembly 70 and the second assembly 80. The first assembly 70, such as an organic light emitting diode assembly, includes a first substrate 701 and an organic electroluminescent unit 703 formed on the first substrate 701. The second assembly 80, such as a color filter assembly, includes a second substrate 801, a color filter layer 805 and a patterned light-shielding layer 806. The color filter layer 805 is formed on the second substrate 801 and has a plurality of colored filter regions with different colors. The colored filter regions are such as red sub-regions 8056, blue sub-regions 8057, green sub-regions 8058 and white sub-regions 8059. Four different colored sub-regions of each pixel region are arranged as a quad-type color filter array. The patterned light-shielding layer 806 formed on the second substrate 801 and between the colored filter regions is disposed around the colored filter regions. As indicated in the OELD device of FIG. 6B, a part 806a of the patterned light-shielding layer 806 contacts the first assembly 70 to maintain a cell gap D between the first assembly 70 and the second assembly 80. In the present embodiment, the part 806a of the patterned light-shielding layer 806 contacting the first assembly 70 is correspondingly located within the blue sub-regions 8057. Exemplarily but not restrictively, the part 806a of the patterned light-shielding layer 806 contacting the first assembly 70 is between a blue sub-region 8057 and the adjacent red sub-region 8056.

Fabricating Method

A fabricating method of the embodiment is disclosed below for elaborating the disclosure. However, the steps as described in the method of the embodiments of the disclosure are for detailed descriptions only, not for limiting the scope of protection of the disclosure. Anyone who is skilled in the technology of the present disclosure may modify or adjust some steps according to actual implementation. The fabricating method of the disclosed embodiments is elaborated with reference to FIG. 2B.

Firstly, a first assembly 40 and a second assembly 50 are provided. The first assembly 40, such as an organic light emitting diode assembly (OLED assembly), includes a first substrate 401 and an organic electroluminescent unit 403. The second assembly 50, such as a color filter (CF) assembly, includes a second substrate 501, a color filter layer 505 and a patterned light-shielding layer 506.

The method for fabricating the second assembly 50 includes the following steps. A second substrate 501 is provided. A color filter layer 505 is formed on the second substrate 501, wherein the color filter layer 505 has a plurality of colored filter regions with different colors (such as red, green, white and blue sub-regions). Then, a patterned light-shielding layer 506 is formed on the color filter layer 505 and correspondingly disposed around the colored filter regions.

Then, the first assembly 40 and the second assembly 50 are assembled with each other, so that a part 506a of the patterned light-shielding layer contacts the first assembly 40 to maintain a cell gap D between the first assembly 40 and the second assembly 50. In an embodiment, a part 506a of the patterned light-shielding layer may be located within the blue sub-region. Exemplarily but not restrictively, a part 506a of the patterned light-shielding layer is located between a blue sub-region and an adjacent sub-region with different color.

Then, a filler 62 disposed between the first assembly 40 and the second assembly 50 is cured, wherein the filler 62 fills up the gap between the color filter layer 505 and the patterned light-shielding layer 506.

In addition, a plurality of spacers 606 may be formed on the color filter layer 505 at the same time with the step of forming the patterned light-shielding layer 506 on the color filter layer 505 as indicated in the second embodiment (FIG. 4B). The spacers 606 and the patterned light-shielding layer 506 are both formed by such as a black matrix. The spacers 606 are such as correspondingly disposed around the blue sub-regions. Apart from a part of the patterned light-shielding layer 506a, the spacers 606 may also contact the first assembly 40 to maintain a cell gap D between the first assembly 40 and the second assembly 50.

According to the OELD device of the disclosed embodiments, the patterned light-shielding layer of the color filter assembly is formed on the color filter layer, and a part of the patterned light-shielding layer contacts the organic light emitting diode assembly to maintain a cell gap between two assemblies. The conventional overcoat layer and photoresist spacers are omitted, the procedures for fabricating of the display device are simplified, the overall thickness of display device is largely thinned, and the problem of color shift is also improved.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic electroluminescent display (OELD) device, at least comprising:
    a first assembly, having a first substrate and an organic electroluminescent unit formed on the first substrate;
    a second assembly assembled with the first assembly, the second assembly comprising:
    a second substrate;
    a color filter layer disposed on the second substrate and having a plurality of colored filter regions with different heights in reference to the second substrate; and
    a patterned light-shielding layer disposed on the color filter layer and in a step structure covering between the colored filter regions,
    wherein a part of the step structure of the patterned light-shielding layer is disposed above the colored filter region having the greatest height and contacting the first assembly to maintain a cell gap between the first assembly and the second assembly.

2. The OELD device according to claim 1, wherein the colored filter regions comprise a plurality of red sub-regions, a plurality of green sub-regions, a plurality of blue sub-regions and a plurality of white sub-regions, and each pixel region comprises one red, one green, one blue and one white sub-regions.

3. The OELD device according to claim 2, wherein the part of the patterned light-shielding layer contacting the first assembly is correspondingly disposed in the blue sub-regions.

4. The OELD device according to claim 2, wherein the red, the green, the blue and the white sub-regions of each pixel region are arranged as a strip-type color filter array or a quad-type color filter array, and the part of the patterned light-shielding layer contacting the first assembly is disposed between the blue sub-regions and adjacent sub-regions with different colors.

5. The OELD device according to claim 2, further comprising a plurality of spacers disposed on the color filter layer and contacting the first assembly, and the spacers and the patterned light-shielding layer are formed by the same material.

6. The OELD device according to claim 5, wherein the spacers are correspondingly disposed around the blue sub-regions.

7. The OELD device according to claim 1, wherein the patterned light-shielding layer is disposed around the colored filter regions.

8. The OELD device according to claim 1, wherein the patterned light-shielding layer is realized by a black matrix.

9. The OELD device according to claim 1, further comprising a filler disposed between the first assembly and the second assembly, and the filler fills up the gap between the color filter layer and the patterned light-shielding layer.

10. A color filter assembly used in an OELD device, at least comprising:
    a substrate;
    a color filter layer disposed on the substrate and having a plurality of colored filter regions with different heights in reference to the substrate; and
    a patterned light-shielding layer disposed on the color filter layer and in a step structure covering between the colored filter regions, wherein a part of the step structure of the patterned light-shielding layer is disposed above the colored filter region having the greatest height, to maintain a cell gap for the OELD device.

11. The color filter assembly according to claim 10, wherein the colored filter regions comprises a plurality of red sub-regions, a plurality of green sub-regions, a plurality of blue sub-regions and a plurality of white sub-regions, and each pixel region comprises one red, one green, one blue and one white sub-regions.

12. The color filter assembly according to claim 11, wherein the red, the green, the blue and the white sub-regions of each pixel region are arranged as a strip-type color filter array or a quad-type color filter array, and the part of the patterned light-shielding layer contacting the first assembly is disposed between the blue sub-regions and adjacent sub-regions with different colors.

13. The color filter assembly according to claim 11, further comprising a plurality of spacers disposed on the color filter layer, and the spacers and the patterned light-shielding layer are formed by the same material.

14. The color filter assembly according to claim 13, wherein the spacers are correspondingly disposed around the blue sub-regions.

15. The color filter assembly according to claim 10, wherein the patterned light-shielding layer is disposed around the colored filter regions.

16. A method for fabricating an OELD device, wherein the method at least comprises:
    providing a first assembly comprising a first substrate and an organic electroluminescent unit formed on the first substrate;
    providing a second assembly, comprising:
    a second substrate;
    a color filter layer formed on the second substrate and having a plurality of color filter regions with different heights in reference to the second substrate; and
    a patterned light-shielding layer disposed on the color filter layer and in a step structure covering between the colored filter regions;
    assembling the first assembly and the second assembly, wherein a part of the step structure of the patterned light-shielding layer is disposed above the colored filter region having the greatest height, and contacting the first assembly to maintain a cell gap between the first assembly and the second assembly.

17. The fabricating method according to claim 16, further comprising a filler disposed between the first assembly and the second assembly, wherein the filler fills up the gap between the color filter layer and the patterned light-shielding layer.

18. The fabricating method according to claim 16, wherein the colored filter regions comprise a plurality of red sub-regions, a plurality of green sub-regions, a plurality of blue sub-regions and a plurality of white sub-regions, and each pixel region comprises one red, one green, one blue and one white sub-regions arranged as a strip-type color filter array or a quad-type color filter array, and the part of the patterned light-shielding layer contacting the first assembly is disposed between the blue sub-regions and adjacent sub-regions with different colors.

19. The fabricating method according to claim 18, wherein a plurality of spacers is formed on the color filter layer at the same time with the step of forming the patterned light-shielding layer on the color filter layer.

20. The fabricating method according to claim 19, wherein the spacers are correspondingly formed around the blue sub-regions.

21. The fabricating method according to claim 16, wherein the patterned light-shielding layer of the second assembly is disposed around the colored filter regions.

* * * * *